United States Patent
Yatagai et al.

(10) Patent No.: US 7,923,268 B2
(45) Date of Patent: Apr. 12, 2011

(54) METHOD OF MEASURING RESISTIVITY OF SIDEWALL OF CONTACT HOLE

(75) Inventors: Youichi Yatagai, Kanagawa (JP); Shinji Kawada, Miyagi (JP); Seiji Samukawa, Sendai (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 49 days.

(21) Appl. No.: 12/546,745

(22) Filed: Aug. 25, 2009

(65) Prior Publication Data

US 2010/0068836 A1   Mar. 18, 2010

(30) Foreign Application Priority Data

Aug. 25, 2008   (JP) .................................. 2008-215897

(51) Int. Cl.
  *H01L 21/66*    (2006.01)
  *H01L 21/4763*  (2006.01)

(52) U.S. Cl. ............ 438/17; 438/18; 438/622; 438/639; 257/E21.531

(58) Field of Classification Search .................... 438/14, 438/17, 18, 622–624, 639; 257/E21.531
See application file for complete search history.

(56) References Cited

U.S. PATENT DOCUMENTS

| | | | | |
|---|---|---|---|---|
| 5,925,577 A | * | 7/1999 | Solis | 438/725 |
| 6,391,669 B1 | * | 5/2002 | Fasano et al. | 438/18 |
| 6,531,327 B2 | * | 3/2003 | Kanamaru et al. | 438/17 |
| 7,135,412 B2 | * | 11/2006 | Na | 438/714 |
| 2008/0026573 A1 | * | 1/2008 | Yanase et al. | 438/667 |

FOREIGN PATENT DOCUMENTS

| JP | 2000-200771 A | 7/2000 |
|---|---|---|
| JP | 2001-053057 A | 2/2001 |

* cited by examiner

*Primary Examiner* — Tuan N. Quach
(74) *Attorney, Agent, or Firm* — Kubotera & Associates LLC.

(57) ABSTRACT

A method of measuring a resistivity of a sidewall of a contact hole formed in a semiconductor device, wherein said semiconductor device includes a first electrode formed on a substrate; a second electrode formed on the first electrode with an insulating film in between; a resist pattern formed on the first electrode and the second electrode; a contact hole formed in the first electrode and the second electrode; and an organic film deposited on the sidewall of the contact hole, includes the steps of: placing a probe needle on the first electrode and the second electrode so that the probe needle contacts with the first electrode and the second electrode several times; establishing electrical conductivity of the probe needle relative to the first electrode and the second electrode; and measuring the resistivity of the organic film between the first electrode and the second electrode.

7 Claims, 11 Drawing Sheets

| | 9.75E+07 | 1.13E+08 | 1.54E+08 | 2.50E+08 | 2.91E+08 | | |
|---|---|---|---|---|---|---|---|
| 2.64E+08 | 2.58E+08 | 2.38E+08 | 3.07E+08 | 3.61E+08 | 4.43E+08 | 4.74E+08 | |
| 4.89E+08 | 3.33E+08 | 2.32E+08 | 2.25E+08 | 3.01E+08 | 4.18E+08 | 4.67E+08 | 5.23E+08 | 4.92E+08 |
| 4.71E+08 | 3.38E+08 | 2.72E+08 | 2.83E+08 | 4.43E+08 | 6.18E+08 | 5.07E+08 | 5.65E+08 | 6.37E+08 |
| 5.06E+08 | 4.22E+08 | 3.62E+08 | 5.29E+08 | 6.43E+08 | 6.79E+08 | 5.73E+08 | 6.24E+08 | 7.12E+08 |
| | 5.15E+08 | 4.82E+08 | 4.97E+08 | 5.25E+08 | 5.66E+08 | 6.30E+08 | 6.78E+08 | |
| | 6.02E+08 | 5.86E+08 | 5.87E+08 | 6.16E+08 | 6.79E+08 | 7.55E+08 | 7.62E+08 | |
| | | | 5.82E+08 | 6.19E+08 | 7.44E+08 | | | |

FIG. 8

METHOD OF MEASURING RESISTIVITY OF SIDEWALL OF CONTACT HOLE

BACKGROUND OF THE INVENTION AND RELATED ART STATEMENT

The present invention relates to a method of measuring a resistivity of a sidewall of a contact hole during a semiconductor manufacturing process. More specifically, the present invention relates to a method of measuring a resistivity of an organic film attached to a sidewall of a contact hole.

Conventionally, there has been an etching method for forming a fine contact hole, in which a dry etching is performed on an object to be processed (for example, a semiconductor wafer or a wafer) (refer to Patent References 1 and 2). As a size of a semiconductor device decreases, an aspect ratio of a contact hole (a ratio of an inner diameter or a width of a contact hole to a depth or a height thereof) increases. Accordingly, there have been several problems associated with the decrease in the size such as an etching stop or an abnormal shape of a contact hole during an etching process, the μ loading effect (a phenomenon in which an etching speed varies due to a variance in a density of a chip pattern on a wafer), and the likes. In particular, charge-up damage due to an electron shading effect may cause a serious problem.

Patent Reference 1: Japanese Patent Publication NO. 2000-200771
Patent Reference 2: Japanese Patent Publication NO. 2001-053057

FIG. 10 is a schematic sectional view showing a wafer for explaining the electron shading effect. As shown in FIG. 10, an MOS transistor is formed on a semiconductor substrate 1 as a part of the wafer. The MOS transistor includes a source region 1a and a drain region 1b formed of an impurity diffused layer arranged on the semiconductor substrate 1 with a specific interval in between. Further, the MOS transistor includes a gate insulating film 2 formed of a silicon dioxide (a $SiO_2$ film) and disposed on the source region 1a and the drain region 1b, and a gate electrode 3 formed on the gate insulating film 2.

In the MOS transistor, an interlayer insulating film 4 formed of a $SiO_2$ film covers an entire surface including the gate electrode 3. A resist pattern 5 formed of a photo-resist film is formed on the interlayer insulating film 4. A dry etching is performed using plasma with the resist pattern 5 as a mask for forming a contact hole 6 in the interlayer insulating film 4.

In the dry etching, electrons 7 and positive ions 8 are generated with plasma. When the contact hole 6 is etched and an aspect ratio thereof increases, the electrons 7 collide with a sidewall of the resist pattern 5. On the other hand, the positive ions 8 tend to vertically irradiate on a bottom portion of the contact hole 6. Accordingly, the sidewall of the resist pattern and an upper inner wall of the contact hole charged up with negative charges.

In this case, the negative charges form an electric field functioning as a barrier against the electrons 7. Accordingly, when the electrons 7 have a small velocity component in a vertical direction relative to the bottom portion of the contact hole 6, the electrons 7 are decelerated with the electric field or even bounced back, thereby making it difficult for the electrons 7 to enter the resist pattern 5. The phenomenon is called the electron shading effect.

When the electron shading effect occurs, a large number of the positive ions 8 irradiate on the bottom portion of the contact hole 6 as compared with that of the electrons 7. Accordingly, a lower sidewall portion of the contact hole 6 (for example, a sidewall of the gate electrode 3 as a lower layer wiring portion) is charged up with positive charges. In forming the contact hole 6, when a charged up potential is generated in the gate electrode 3 as the lower layer wiring portion, there may be serious charge up damage such as damage in the gate insulating film 2 formed below the gate electrode 3.

In order to suppress or prevent the charge up damage, Patent Reference 1 has disclosed a technology. In the technology disclosed in Patent Reference 1, a plasma processing method is adopted for preventing the charge up damage due to the electron shading effect, so that it is possible to form a contact hole with a desirable high aspect ratio. Patent Reference 2 has disclosed a method of wiring and producing an MOS transistor capable of suppressing the charge up damage.

Non-Patent References 1 and 2 have disclosed that when a contact hole is formed through a plasma etching with a resist pattern formed of a resist film as a mask, a fluorocarbon (CF) gas is used as an etching gas. As a result, an organic film with conductivity is deposited on a bottom surface and a sidewall of the contact hole, thereby alleviating charge up generated in a lower layer wiring portion.

Non-Patent Reference 1: J. Vac. Technol. B. 22[2] (March/April 2004) T. Shimura P. 533-538
Non-Patent Reference 2: Proc. Symp. on Dry Process (2002) S. Soda P. 281-284

In Non-Patent References 1 and 2, the organic film deposited on the bottom surface and the sidewall of the contact hole is eventually removed when the resist film is removed. It is necessary to form the organic film having a sufficient amount, otherwise it is difficult to reduce the electron shading effect. In order words, in order to reduce the electron shading effect and improve reliability of the semiconductor manufacturing process, it is necessary to stably form the organic film having a sufficient amount in the semiconductor manufacturing process. To this end, it is imperative to measure conductivity (that is, a resistivity) of the organic film deposited on the bottom surface and the sidewall of the contact hole.

As described above, in forming the contact hole, it is necessary to form the organic film having a sufficient amount on the sidewall of the contact hole. To this end, it is imperative to measure a resistivity of the organic film.

According to Non-Patent Reference 1, the resistivity of the organic film is measured using a method shown in FIG. 11. FIG. 11 is a schematic view showing a conventional method of measuring the resistivity of the organic film deposited on the sidewall of the contact hole.

As shown in FIG. 11, in the conventional method of measuring the resistivity of the organic film, first, a mock-up model (a sample) having a contact hole is prepared. In the sample, a lower electrode 12 formed of a poly-silicon film is formed on a silicon (Si) substrate 10 with a $SiO_2$ film 11 as an insulating film in between. An upper electrode 14 formed of a poly-silicon film is formed on the lower electrode 12 with a $SiO_2$ film 13 in between, and a $SiO_2$ film 15 is formed on the upper electrode 14. A contact hole 16 is formed in the $SiO_2$ film 15, the upper electrode 14, and the $SiO_2$ film 13 through a plasma etching with a resist pattern (not shown) as a mask. The resist pattern is removed after the contact hole 16 is formed.

In the next step, the sample is placed in an etching chamber. In the etching chamber, an organic film is deposited on a sidewall of the contact hole 16 using a fluorocarbon gas ($C_4F_8$). Then, argon ions (Ar) are irradiated on the sample for promoting polymerization of the organic film on the sidewall of the contact hole 16. In the last step, after the sample is removed from the etching chamber, a voltage is applied between the upper electrode 14 and the lower electrode 12, thereby measuring a current value to determine the resistivity of the organic film.

In the conventional method of measuring the resistivity of the organic film, the organic film is deposited after the contact hole 16 is formed in the sample. Accordingly, the organic film does not contain a sputter compound of the resist pattern or an etching reaction product.

In an ordinary dry etching process, an organic film is deposited concurrently with the Ar irradiation. In the conventional method of measuring the resistivity of the organic film, on the other hand, the Ar irradiation is performed after the organic film is deposited. Accordingly, the organic film has a property different from that of an organic film deposited on a sidewall of a contact hole formed through an ordinary oxide film contact etching (that is, the organic film formed in the ordinary semiconductor manufacturing process). Accordingly, it is difficult to form an actual organic film formed in the ordinary semiconductor manufacturing process.

To this end, in the method shown in FIG. 11, after the contact hole 16 is formed, it may be arranged to measure the resistivity of the organic film deposited on the sidewall of the contact hole using the sample without removing the resist pattern through asking or cleaning. In this case, the resist film and the organic film are deposited on the lower electrode 12 and the upper electrode 14. Accordingly, it is difficult to secure a sufficient electrical contact for applying a voltage to measure a current value, thereby making it difficult to measure the resistivity of the organic film.

Alternatively, an additional step may be provided for exposing a part of the lower electrode 12 and the upper electrode 14 where an electrical contact is established. However, in this case, it is necessary to dispose an extra resist pattern for exposing the part of the lower electrode 12 and the upper electrode 14 through etching. Accordingly, an original organic film may have a varied property, thereby making it difficult to measure the resistivity of the organic film.

In view of the problem described above, an object of the present invention is to provide a method of measuring a resistivity of a sidewall of a contact hole during a semiconductor manufacturing process, in which it is possible to accurately measure the resistivity of the organic film.

Further objects and advantages of the invention will be apparent from the following description of the invention.

SUMMARY OF THE INVENTION

In order to attain the objects described above, according to an aspect of the present invention, a method of measuring a resistivity of a sidewall of a contact hole is applied to a semiconductor device. The semiconductor device includes a first electrode formed on a substrate; a second electrode formed on the first electrode with an insulating film in between; a resist pattern formed of a resist film (for example, a photo-resist film) and selectively formed on the second electrode; a contact hole formed through a plasma etching with the resist pattern as a mask and penetrating the first electrode and the second electrode; and an organic film deposited on the sidewall of the contact hole when the contact hole is formed.

The method of measuring the resistivity of the sidewall of the contact hole includes the steps of placing a probe needle on the first electrode and the second electrode in a state that the resist pattern is formed on the first electrode and the second electrode so that the probe needle contacts with the first electrode and the second electrode several times; establishing electrical conductivity of the probe needle relative to the first electrode and the second electrode; and measuring the resistivity of the organic film between the first electrode and the second electrode.

In the aspect of the present invention, the method of measuring the resistivity of the sidewall of the contact hole includes the step of placing the probe needle on the first electrode and the second electrode in the state that the resist pattern is formed on the first electrode and the second electrode so that the probe needle contacts with the first electrode and the second electrode several times; and establishing the electrical conductivity of the probe needle relative to the first electrode and the second electrode. Accordingly, it is possible to measure the resistivity of the organic film in an original state. As a result, when the organic film is not completely deposited, the resistivity of the organic film exhibits a value greater than a specific value. When the organic film is properly deposited for a mass production process, the resistivity of the organic film exhibits a value similar to the specific value.

BRIEF DESCRIPTION OF THE DRAWINGS

FIGS. 1(a) to 1(c) are schematic sectional views showing a method of measuring a resistivity of a sidewall of a contact hole according to a first embodiment of the present invention, wherein FIG. 1(a) is a schematic sectional view showing a semiconductor device, FIG. 1(b) is a schematic sectional view showing one step of the method, and FIG. 1(c) is a schematic sectional view showing another step of the method;

FIG. 8 is a plan view showing a wafer map according to a third embodiment of the present invention;

DETAILED DESCRIPTION OF PREFERRED EMBODIMENTS

Figure 1A:
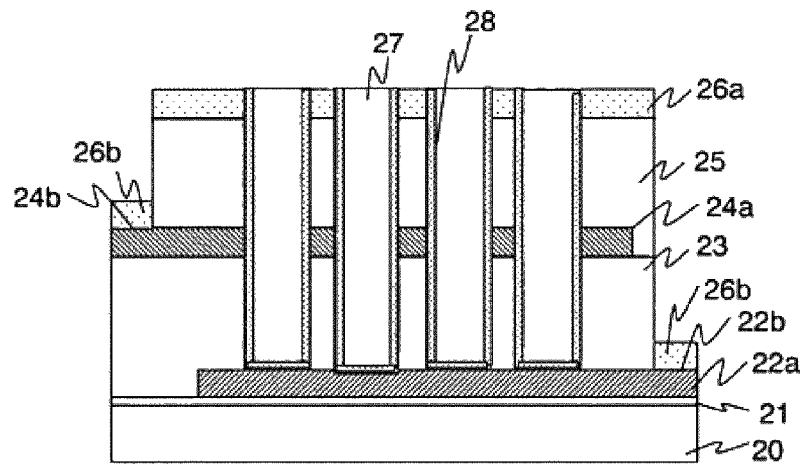

Hereunder, embodiments of the present invention will be explained with reference to the accompanying drawings. The drawings are schematically shown for explanation of the present invention, and the present invention is not limited to the embodiments shown in the drawings.

First Embodiment

Figure 1B:
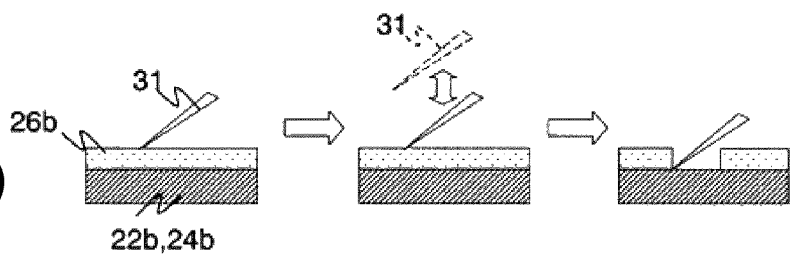
Figure 1C:
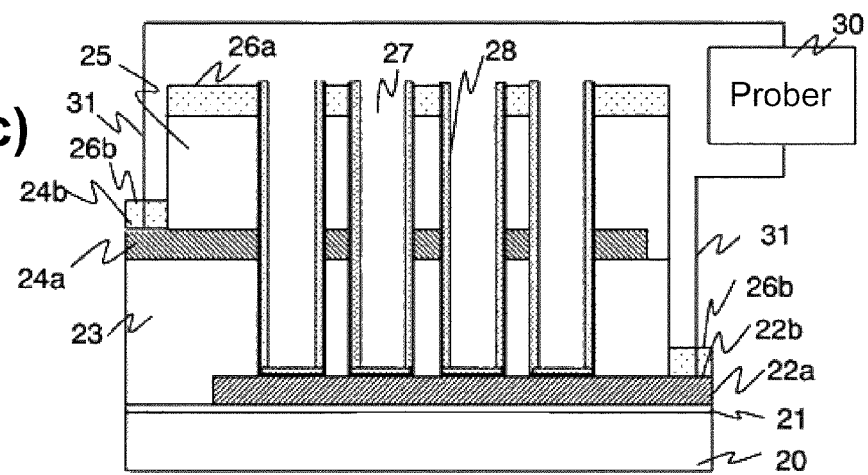

A first embodiment of the present invention will be explained. FIGS. 1(a) to 1(c) are schematic sectional views showing a method of measuring a resistivity of a sidewall of a contact hole according to a first embodiment of the present invention. More specifically, FIG. 1(a) is a schematic sectional view showing a semiconductor device, FIG. 1(b) is a schematic sectional view showing one step of the method, and FIG. 1(c) is a schematic sectional view showing another step of the method.

In the embodiment, the method is adopted to measure a resistivity of an organic film on the sidewall of the contact hole. In the method, first, a semiconductor device having the contact hole as a mock-up model (a sample) is prepared.

In the sample, as shown in FIG. 1(a), a lower electrode 22a (for example, a patterned poly-silicon film or a poly-Si film) as a first electrode is formed on a silicon substrate (for example, a Si substrate) with an insulating film 21 (for example, a thermal oxide film) in between. An interlayer insulating film 23 (for example, a boron phosphor silicate glass film or a BPSG film) covers the lower electrode 22a. An upper electrode 24a (for example, a patterned poly-silicon film) is formed on the interlayer insulating film 23, and an interlayer insulating film 25 (for example, a BPSG film) covers the upper electrode 24a.

In the next step, a part of the BPSG film 25 is etched up to a depth reaching the poly-Si film 24a, so that an electrode pad 24b of the poly-Si film 24a is exposed. Further, a part of the BPSG film 25 and the BPSG film 23 is etched up to a depth reaching the poly-Si film 22a, so that an electrode pad 22b of the poly-Si film 22a is exposed. Then, a photo-resist film is deposited on a whole surface including the poly-Si film 24a, and the photo-resist film on the poly-Si film 24a is patterned to form a resist pattern 26a (for example, a hole pattern).

In the next step, the interlayer insulating film 25, the poly-Si film 24a, and the interlayer insulating film 23 are etched up to a depth reaching the poly-Si film 22a through a plasma etching using a fluorocarbon gas (for example, $C_4F_8$) with the hole pattern 26a as a mask, thereby forming contact holes 27. At the same time, organic films 28 are deposited on sidewalls of the contact holes 27.

In the next step, argon ions (Ar) are irradiated on the sample for promoting polymerization of the organic films 28 on the sidewalls of the contact hole 27. Note that when the photo-resist film is deposited and the contact holes 27 are formed, an organic resist film 26b covers the electrode pad 22b of the poly-Si film 22a and the electrode pad 24b of the poly-Si film 24a thus exposed.

In the next step, as shown in FIG. 1(b), the sample is placed on a stage of a prober 30 (for example, a manual prober), so that a resistivity of the organic films 28 deposited on the sidewalls of the contact holes 27 is measured. The manual prober 30 includes the stage capable of moving along a horizontal X-Y axis for placing the sample; a microscope; a probe needle 31; and a current meter, so that the prober 30 is capable of measuring a resistivity of a fine circuit and the likes.

In the embodiment, it is arranged to push the probe needle 31 against the electrode pad 22b and the electrode pad 24b several times (for example, ten times) to contact with the electrode pad 22b and the electrode pad 24b, so that the organic resist film 26b is removed until the electrode pad 22b and the electrode pad 24b covered with the organic resist film 26b are exposed. As a result, electrical conductivity is established between the probe needle 31, and the electrode pad 22b and the electrode pad 24b.

In the next step, as shown in FIG. 1(c), the prober 30 applies a specific voltage (for example, about 10 V) between the poly-Si film 24a at an upper portion and the poly-Si film 22a at a lower portion, so that a current value is measured to determine the resistivity of the organic films 28 deposited on the sidewalls of the contact holes 27.

A method of producing the sample as an object of the process of measuring the resistivity will be explained next. FIGS. 2(a) to 2(e) are schematic sectional views No. 1 showing the process of producing the sample as the object of the method of measuring the resistivity of the sidewall of the contact hole 27 according to the first embodiment of the present invention.

Figure 3A:
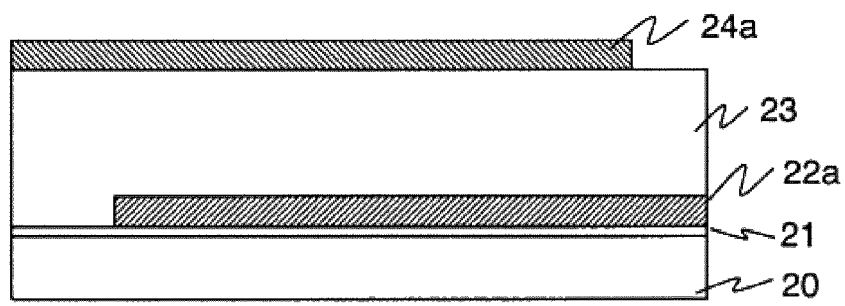
FIGS. 3(a) to 3(c) are schematic sectional views No. 2 showing the process of producing the sample as the object of the method of measuring the resistivity of the sidewall of the contact hole according to the first embodiment of the present invention.
Figure 3B:
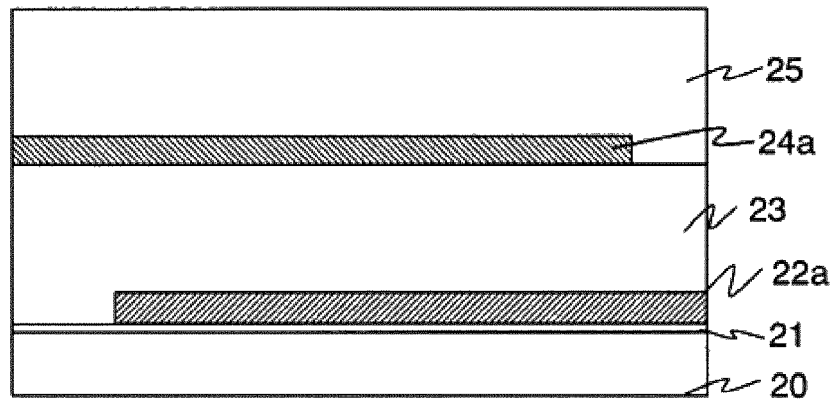
Figure 3C:
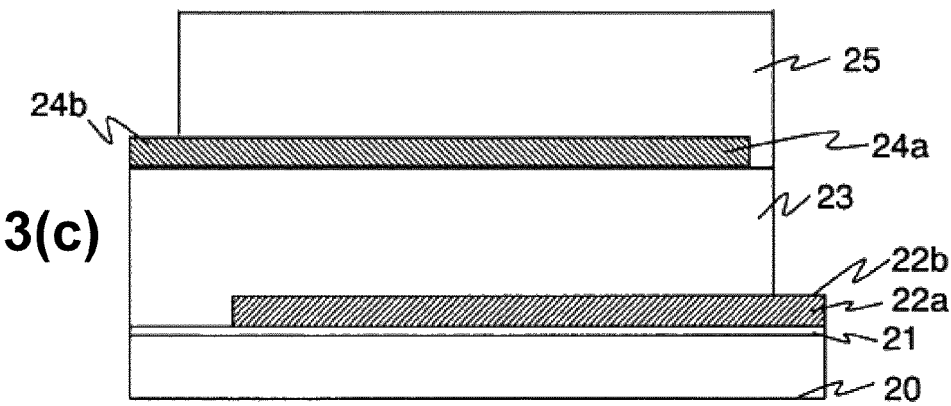
Figure 4A:
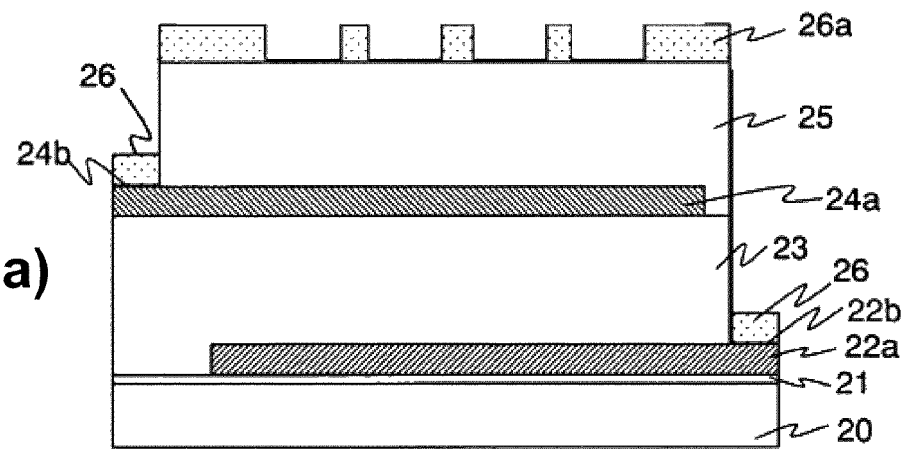
FIGS. 4(a) to 4(c) are schematic sectional views No. 3 showing the process of producing the sample as the object of the method of measuring the resistivity of the sidewall of the contact hole according to the first embodiment of the present invention.
Figure 4B:
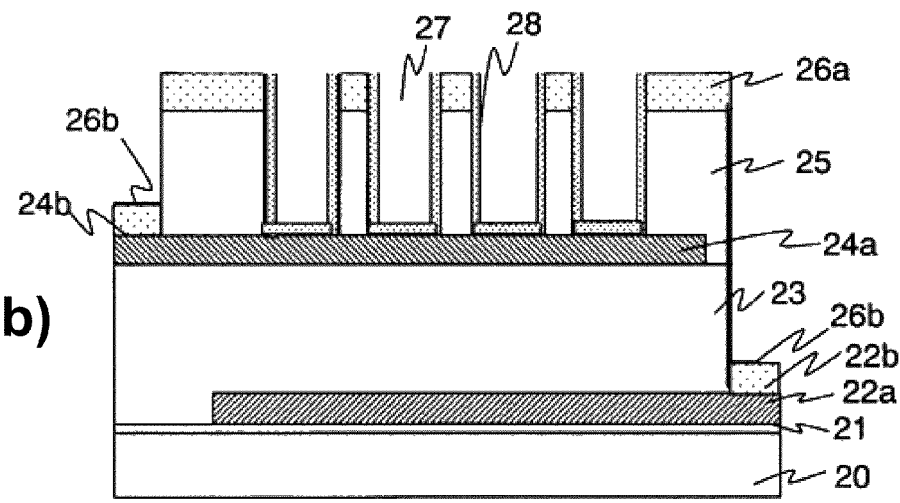
Figure 4C:
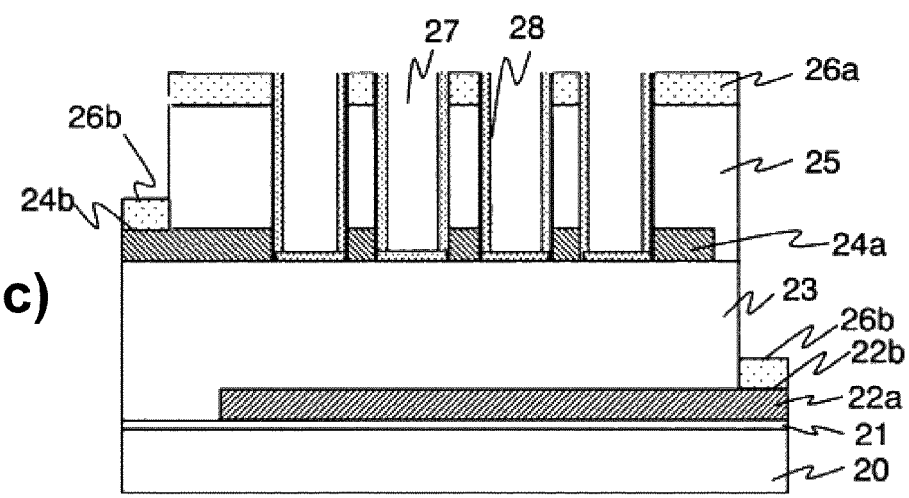

FIGS. 3(a) to 3(c) are schematic sectional views No. 2 showing the process of producing the sample as the object of the method of measuring the resistivity of the sidewall of the contact hole 27 according to the first embodiment of the present invention. FIGS. 4(a) to 4(c) are schematic sectional views No. 3 showing the process of producing the sample as the object of the method of measuring the resistivity of the sidewall of the contact hole 27 according to the first embodiment of the present invention.

Figure 2A:
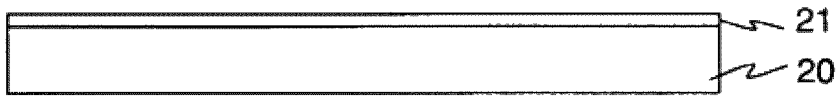
FIGS. 2(a) to 2(e) are schematic sectional views No. 1 showing a process of producing a sample as an object of the method of measuring the resistivity of the sidewall of the contact hole according to the first embodiment of the present invention.
Figure 2B:
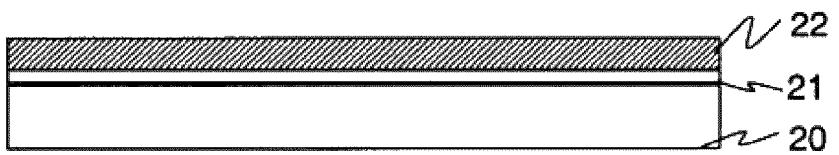

As shown in FIG. 2(a), first, the thermal oxide film 21 having a thickness of about 100 nm is formed on the silicon substrate 20. In the next step, as shown in FIG. 2(b), the poly-Si film 22a having a thickness of about 300 nm and a specific phosphor concentration (for example, $6 \times 10^{20}$ cm$^{-3}$) is formed on the insulating film 21 with a chemical vapor deposition (CVD) method.

Figure 2C:
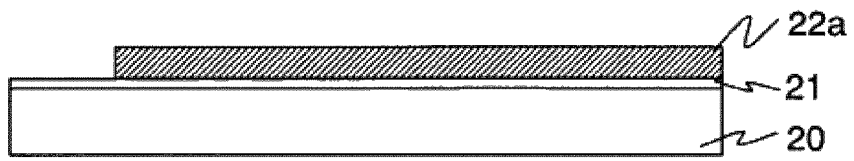

In the next step, as shown in FIG. 2(c), an electrode pattern formed of a photo-resist film is formed through a lithography technology. Then, the poly-Si film 22a is processed through an etching technology with the electrode pattern as a mask, thereby forming the poly-Si film 22a as the patterned film to be the lower electrode.

Figure 2D:
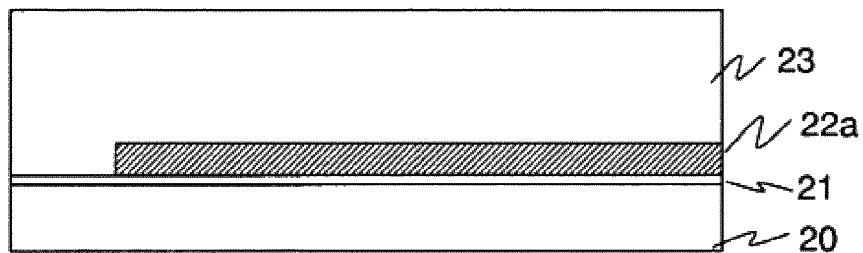
Figure 2E:
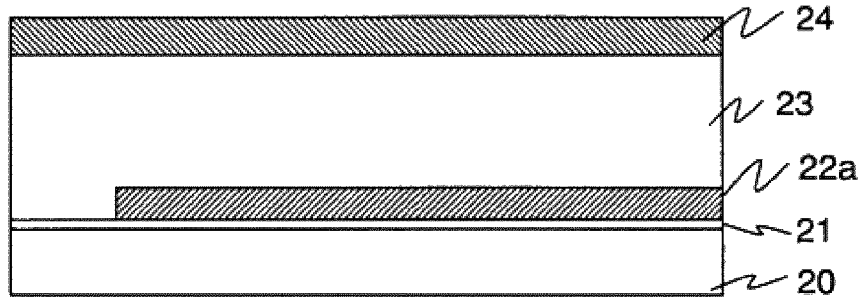

In the next step, as shown in FIG. 2(d), after the poly-Si film 22a is formed, the interlayer insulating film 23 having a thickness of about 500 nm is formed with the CVD method. In the next step, as shown in FIG. 2(e), the poly-Si film 24a having a thickness of about 300 nm and a specific phosphor concentration (for example, $6 \times 10^{20}$ cm$^{-3}$) is formed with the CVD method.

In the next step, as shown in FIG. 3(a), an electrode pattern formed of a photo-resist film is formed through the lithography technology. Then, the poly-Si film 24a is processed through the etching technology with the electrode pattern as a mask, thereby forming the poly-Si film 24a as the patterned film to be the upper electrode. In the next step, as shown in FIG. 3(b), after the poly-Si film 24a is formed, the interlayer insulating film 25 having a thickness of about 500 nm is formed over a whole surface with the CVD method.

In the next step, as shown in FIG. 3(c), a resist remove pattern formed of a photo-resist film is formed through the lithography technology. Then, a part of the interlayer insulating film 25, the poly-Si film 24a, and the interlayer insulating film 23 is removed with the resist remove pattern as a mask. As a result, the electrode pad 24b of the poly-Si film 24a at the upper portion and the electrode pad 22b of the poly-Si film 22a at the lower portion are exposed.

In the next step, as shown in FIG. 4(a), a photo-resist film 26 covers a whole surface, and the hole pattern 26a having a diameter of 300 nm is formed through the lithography technology.

In the next step, as shown in FIG. 4(b), the interlayer insulating film 25 is processed through a dry etching technology with the hole pattern 26a as a mask. The dry etching is performed using a thermal oxide film etching device of a two frequency reactive dry etching type under specific conditions (for example, a pressure of 30 mTorr, an etching gas of $C_4F_8$/$O_2$/Ar=20/30/500 sccm, an upper/lower power of 2000/1000 W).

The thermal oxide film etching device of the two frequency reactive dry etching type includes an electrode of a parallel plate type having an upper electrode and a lower electrode, and a distance between the electrodes is small. A frequency of, for example, 60 MHZ is applied to the upper electrode for controlling a plasma density, and a frequency of, for example, 1.6 MHZ is applied to the lower electrode for controlling ion energy. Accordingly, as opposed to an ordinary RIE device, it is possible to control the ion energy independent of the plasma density.

In the next step, as shown in FIG. 4(c), the poly-Si film 24a is processed through the dry etching technology to form the contact holes 27 using an ICP type etching device. The dry etching is performed under specific conditions (for example, a pressure of 5 mTorr, an etching gas of $Cl_2$/$O_2$=80/2 sccm, an upper/lower power of 250/50 W). The ICP type etching device includes an inductive coupling plasma as an ion source. In the ICP type etching device, a filament is not used, thereby reducing damage due to a reactive gas. Accordingly, it is possible to easily introduce a reactive gas such as $O_2$ and $Cl_2$, so that the ICP type etching device is suitable for high reactive ion beam etching.

In the next step, as shown in FIG. 1(a), the interlayer insulating film 23 is processed through the dry etching technology to form the contact holes 27 using the thermal oxide film etching device of the two frequency reactive dry etching type. The dry etching is performed under specific conditions (for example, a pressure of 30 mTorr, an etching gas of $C_4F_8$/$O_2$/Ar=20/30/500 sccm, an upper/lower power of 2000/1000 W). In this step, the organic films 28 formed of a sputter compound from the resist film and an etching reaction product are deposited on the sidewalls of the contact holes 27. Through the steps described above, the sample is completed.

In the next step, as shown in FIG. 1(c), the sample is placed on the stage of the prober 30, so that the resistivity of the organic films 28 deposited on the sidewalls of the contact holes 27 is measured. Then, the probe needle 31 is pushed against the electrode pad 22b and the electrode pad 24b covered with the organic resist film 26b several times (for example, ten times) to remove the organic resist film 26b, so that the probe needle 31 electrically contacts with the electrode pad 22b of the poly-Si film 22a at the lower portion and the electrode pad 24b of the poly-Si film 24a at the upper portion.

In the next step, the prober 30 applies a specific voltage (for example, about 10 V) between the poly-Si film 24a at the upper portion and the poly-Si film 22a at the lower portion, so that a current value is measured to determine the resistivity of the organic films 28, thereby completing the process of measuring the resistivity.

As described above, in the embodiment, while the organic films 28 is deposited on the sidewalls of the contact holes 27 and the organic resist film 26b is formed on the electrode pad 24b and the electrode pad 22b, the probe needle 31 contacts with the electrode pad 22b and the electrode pad 24b several times (for example, ten times), so that the probe needle 31 electrically contacts with the electrode pad 22b of the poly-Si film 22a. Accordingly, it is possible to measure the resistivity of the organic films 28 in the original state. In other words, when the current value is measured to determine the resistivity of the organic films 28, the probe needle 31 contacts with the electrode pad 22b and the electrode pad 24b about ten time. Accordingly, it is possible to remove the organic resist film 26b on the electrode pad 22b and the electrode pad 24b, and electrically contact the probe needle 31 with the electrode pad 22b and the electrode pad 24b.

In the embodiment, after the contact holes 27 are formed, it is possible to easily and accurately measure the resistivity of the organic films 28 deposited on the sidewalls of the contact holes 27 without removing the resist film and the likes through asking or cleaning. Accordingly, even when the organic films 28 do not adhere completely, it is possible to accurately measure the resistivity of the organic films 28.

Second Embodiment

A second embodiment of the present invention will be explained next. Components in the second embodiment similar to those in the first embodiment are designated with the same reference numerals. FIGS. 5(a) to 5(e) are schematic sectional views No. 1 showing a process of producing a sample as an object of a method of measuring a resistivity of a sidewall of the contact hole 27 according to a second embodiment of the present invention.

Figure 6A:
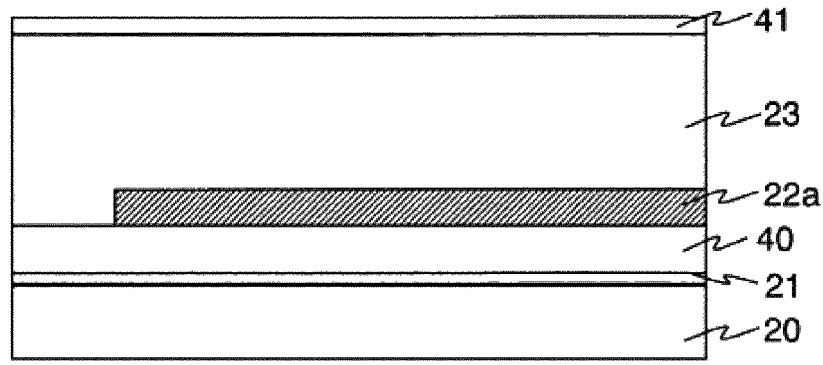
FIGS. 6(a) to 6(c) are schematic sectional views No. 2 showing the process of producing the sample as the object of the method of measuring the resistivity of the sidewall of the contact hole according to the second embodiment of the present invention.
Figure 6B:
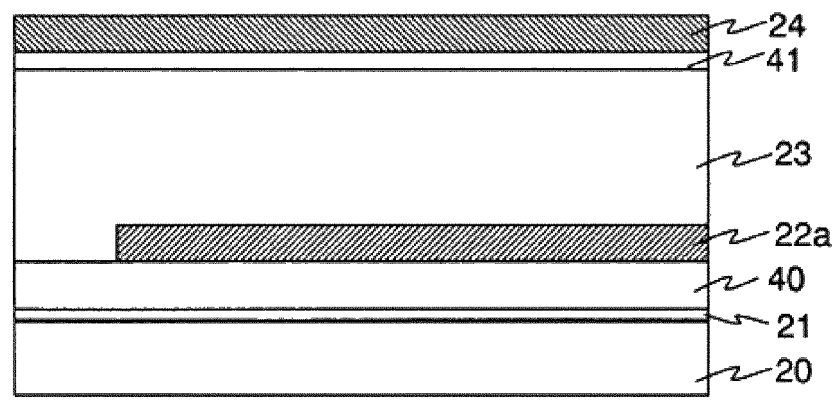
Figure 6C:
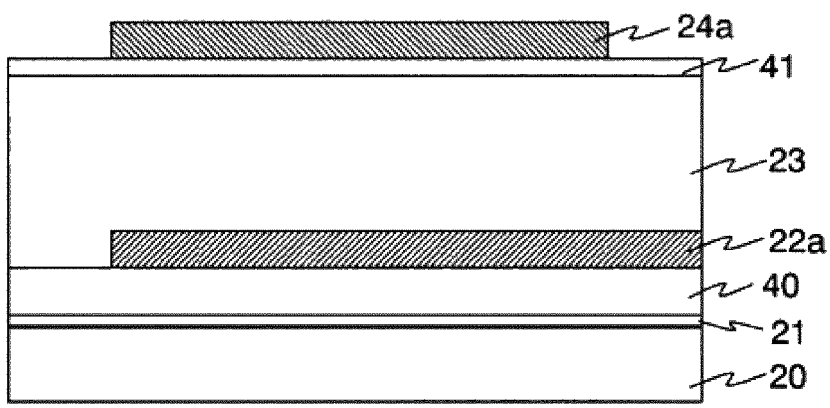
Figure 7A:
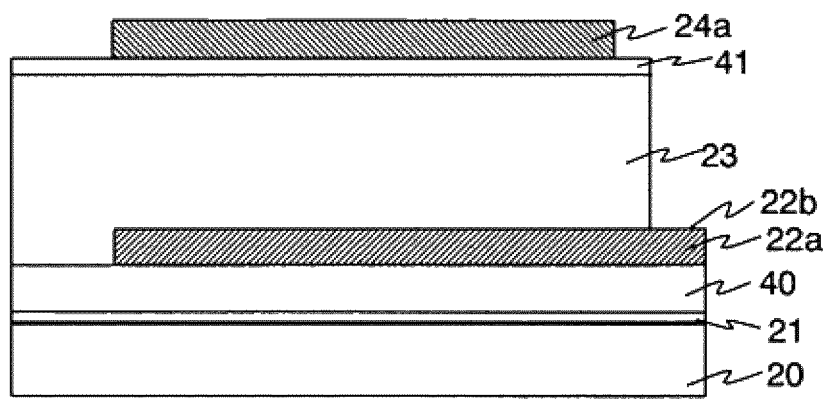
FIGS. 7(a) to 7(c) are schematic sectional views No. 3 showing the process of producing the sample as the object of the method of measuring the resistivity of the sidewall of the contact hole according to the second embodiment of the present invention.
Figure 7B:
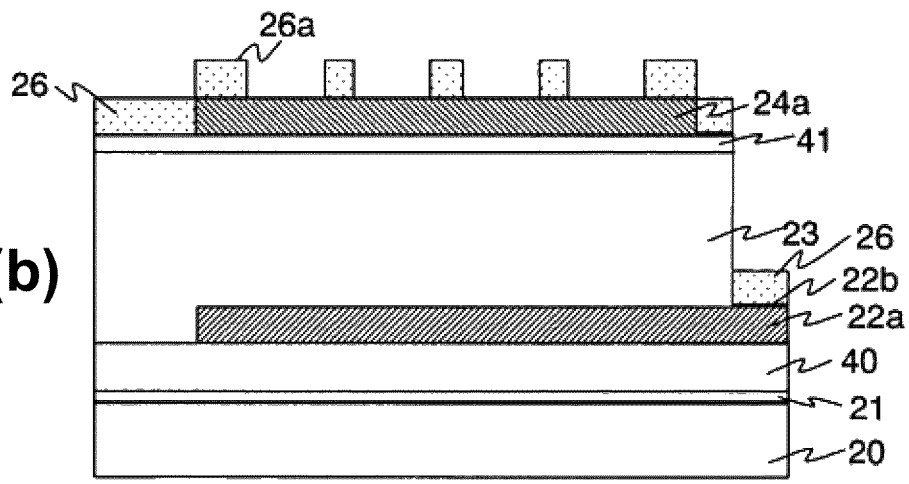
Figure 7C:
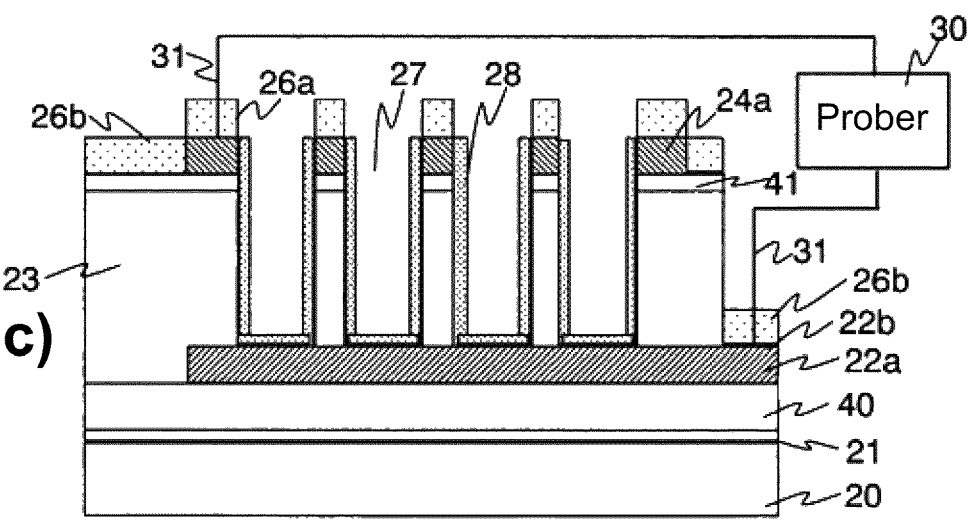

FIGS. 6(a) to 6(c) are schematic sectional views No. 2 showing the process of producing the sample as the object of the method of measuring the resistivity of the sidewall of the contact hole 27 according to the second embodiment of the present invention. FIGS. 7(a) to 7(c) are schematic sectional views No. 3 showing the process of producing the sample as the object of the method of measuring the resistivity of the sidewall of the contact hole 27 according to the second embodiment of the present invention.

In the second embodiment, as shown in FIG. 7(c), the sample as the object of the method of measuring the resistivity has a structure different from that in the first embodiment. In particular, in the sample in the first embodiment, the poly-Si film 24a as the upper electrode is situated at a middle portion of the contact holes 27. In the sample in the second embodiment, the poly-Si film 24a as the upper electrode is situated at an upper portion of the contact holes 27.

Similar to the first embodiment, in the method of measuring the resistivity in the second embodiment, the sample having the contact holes 27 is prepared first.

In the sample, as shown in FIG. 7(c), the lower electrode 22a (for example, a patterned poly-silicon film or a poly-Si film) is formed on the silicon substrate 20 (for example, a Si substrate) with the insulating film 11 (for example, a thermal oxide film) and an interlayer insulating film 40 (for example, a non-doped silicon glass film) in between. The interlayer insulating film 23 (for example, a patterned boron phosphor silicate glass film or a BPSG film) covers the lower electrode 22a. The upper electrode 24a (for example, a patterned poly-silicon film) is formed on the interlayer insulating film 23 with an interlayer insulating film 41 (for example, a patterned BPSG film) in between.

In the next step, a part of the BPSG film 25 is etched up to a depth reaching the poly-Si film 24a, so that the electrode pad 22b of the poly-Si film 22a is exposed. Then, a photo-resist film is deposited on a whole surface including the poly-Si film 24a, and the photo-resist film on the poly-Si film 24a is patterned to form the resist pattern 26a.

In the next step, the poly-Si film 24a, the interlayer insulating film 41, and the interlayer insulating film 23 are etched up to a depth reaching the poly-Si film 22a through the plasma etching using a fluorocarbon gas (for example, $C_4F_8$) with the hole pattern 26a as a mask, thereby forming the contact holes 27. At the same time, the organic films 28 are deposited on the sidewalls of the contact holes 27. Then, argon ions (Ar) are irradiated on the sample for promoting polymerization of the organic films 28 on the sidewalls of the contact holes 27. Note that when the photo-resist film is deposited and the contact holes 27 are formed, the organic resist film 26b covers the interlayer insulating film 41 and the electrode pad 22b of the poly-Si film 22a thus exposed.

In the next step, the sample is placed on the stage of the prober 30 (for example, a manual prober), so that the resistivity of the organic films 28 deposited on the sidewalls of the contact holes 27 is measured. Then, the probe needle 31 is pushed against the electrode pad 22b and the electrode pad 24b several times (for example, ten times) to contact with the electrode pad 22b and the electrode pad 24b, so that the hole pattern 26a and the organic resist film 26b are removed until the electrode pad 22b and the electrode pad 24b covered with the hole pattern 26a and the organic resist film 26b are exposed. As a result, electrical conductivity is established between the probe needle 31 and the electrode pad 22b at the lower portion and the electrode pad 24b at the upper portion.

In the next step, the prober 30 applies a specific voltage (for example, about 10 V) between the poly-Si film 24a at the upper portion and the poly-Si film 22a at the lower portion, so that a current value is measured to determine the resistivity of the organic films 28 deposited on the sidewalls of the contact holes 27.

A method of producing the sample as the object of the method of measuring the resistivity will be explained next with reference to FIGS. 5(a)-5(e), 6(a)-6(c), and 7(a)-7(c).

Figure 5A:
FIGS. 5(a) to 5(e) are schematic sectional views No. 1 showing a process of producing a sample as an object of a method of measuring a resistivity of a sidewall of a contact hole according to a second embodiment of the present invention.
Figure 5B:
Figure 5C:
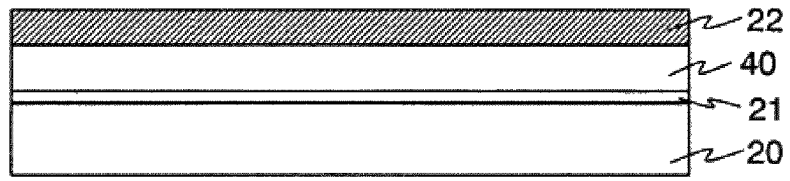

As shown in FIG. 5(a), first, the thermal oxide film 21 having a thickness of about 100 nm is formed on the silicon substrate 20. In the next step, as shown in FIG. 5(b), the interlayer insulating film 40 having a thickness of about 500 nm is formed with the CVD method. In the next step, as shown in FIG. 5(c), the poly-Si film 22a having a thickness of about 300 nm and a specific phosphor concentration (for example, $6\times10^{20}$ cm$^{-3}$) is formed with the CVD method.

Figure 5D:
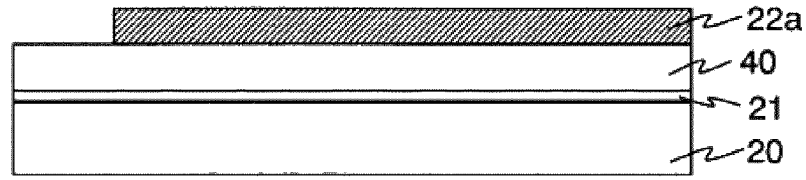
Figure 5E:
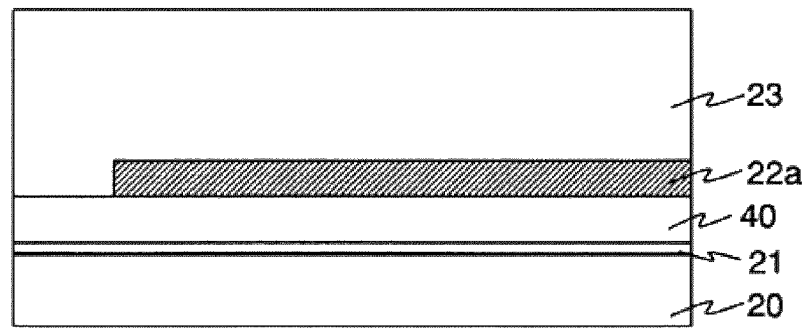

In the next step, as shown in FIG. 5(d), an electrode pattern formed of a photo-resist film is formed through the lithography technology. Then, the poly-Si film 22a is processed through the etching technology with the electrode pattern as a mask, thereby forming the poly-Si film 22a as the patterned film to be the lower electrode. In the next step, as shown in FIG. 5(e), the interlayer insulating film 23 having a thickness of about 1,000 nm is formed with the CVD method.

In the next step, as shown in FIG. 6(a), the interlayer insulating film 41 having a thickness of about 100 nm is formed with the CVD method. In the next step, as shown in FIG. 6(b), the poly-Si film 24a having a thickness of about 300 nm and a specific phosphor concentration (for example, $6\times10^{20}$ cm$^{-3}$) is formed with the CVD method.

In the next step, as shown in FIG. 6(c), an electrode pattern formed of a photo-resist film is formed through the lithography technology. Then, the poly-Si film 24a is processed through the etching technology with the electrode pattern as a mask, thereby forming the poly-Si film 24a as the patterned film to be the upper electrode.

In the next step, as shown in FIG. 7(a), a resist remove pattern formed of a photo-resist film is formed through the lithography technology. Then, a part of the interlayer insulating film 41 and the interlayer insulating film 23 is removed with the resist remove pattern as a mask through the etching technology. As a result, the electrode pad 22b of the poly-Si film 22a at the lower portion is exposed.

In the next step, as shown in FIG. 7(b), the photo-resist film 26 covers a whole surface, and the hole pattern 26a having a diameter of 300 nm is formed through the lithography technology.

In the next step, as shown in FIG. 7(c), the poly-Si film 24a, the interlayer insulating film 41, and the interlayer insulating film 23 are processed through the dry etching technology with the hole pattern 26a as a mask. The dry etching is performed using the thermal oxide film etching device of the two frequency reactive dry etching type under specific conditions (for example, a pressure of 30 mTorr, an etching gas of $C_4F_8/O_2/Ar=20/30/500$ sccm, an upper/lower power of 2000/1000 W). In this step, the organic films 28 formed of a sputter compound from the resist film and an etching reaction product are deposited on the sidewalls of the contact holes 27. Through the steps described above, the sample is completed.

In the next step, as shown in FIG. 1(b), the sample is placed on the stage of the prober 30, so that the resistivity of the organic films 28 deposited on the sidewalls of the contact holes 27 is measured. Then, the probe needle 31 is pushed against the electrode pad 22b and the electrode pad 24b covered with the hole pattern 26a and the organic resist film 26b several times (for example, ten times) to remove the hole pattern 26a and the organic resist film 26b, so that the probe needle 31 electrically contacts with the electrode pad 22b of the poly-Si film 22a at the lower portion and the electrode pad 24b of the poly-Si film 24a at the upper portion.

In the next step, the prober 30 applies a specific voltage (for example, about 10 V) between the poly-Si film 24a at the upper portion and the poly-Si film 22a at the lower portion, so that a current value is measured to determine the resistivity of the organic films 28, thereby completing the process of measuring the resistivity.

In the second embodiment, it is possible to obtain an effect similar to that in the first embodiment. Further, an additional effect is obtained as follows.

In the first embodiment, the poly-Si film 24a as the upper electrode is situated at the middle portion of the contact holes 27. Accordingly, the resistivity of the organic films 28 is limited between the middle portion and the bottom portion of the contact holes 27. On the other hand, in the second embodiment, the poly-Si film 24a as the upper electrode is situated at the upper portion of the contact holes 27. Accordingly, it is possible to measure the resistivity of the whole portion of the organic films 28 deposited on the sidewalls of the contact holes 27.

Third Embodiment

A third embodiment of the present invention will be explained next.

In the third embodiment, instead of the prober 30 used in the first and second embodiments, an auto prober is used to measure the current value with respect to the organic films 28 deposited on the sidewalls of the contact holes 27 for all shots of the samples, thereby determining the resistivity.

In the embodiment, a plurality of samples is formed on a wafer, and the wafer is placed on a stage of the auto prober. In the auto prober, a processor controls the stage to move in an arbitrary direction on a horizontal plane having an X axis and a Y axis according to a specific measurement program, so that the samples on the wafer are sequentially and automatically probed. The auto prober measures the resistivity under conditions such as an overdrive amount of 100 μm, a temperature of 30° C., a shot number of 60 shots, a measurement time of two hours per one wafer, and BASIC measurement software.

FIG. 8 is a plan view showing a wafer map according to the third embodiment of the present invention. As described above, the auto prober is used to measure the current value with respect to all shots of the samples, thereby determining the resistivity of the organic films 28 deposited on the sidewalls of the contact holes 27. Accordingly, it is possible to map the resistivity of the organic films 28. An electrical property data of an actual product is converted into a wafer map. Accordingly, when the resistivity is converted into the wafer map, it is possible to evaluate a relationship between the electrical property data and the resistivity.

Further, in the third embodiment, it is possible to measure one sample in a period of time about one fifth of that of the prober 30 in the first and second embodiment, thereby reducing the number of measurement steps. Further, it is possible to reduce an influence of a change in a film property due to moisture in atmosphere.

Fourth Embodiment

Figure 9:
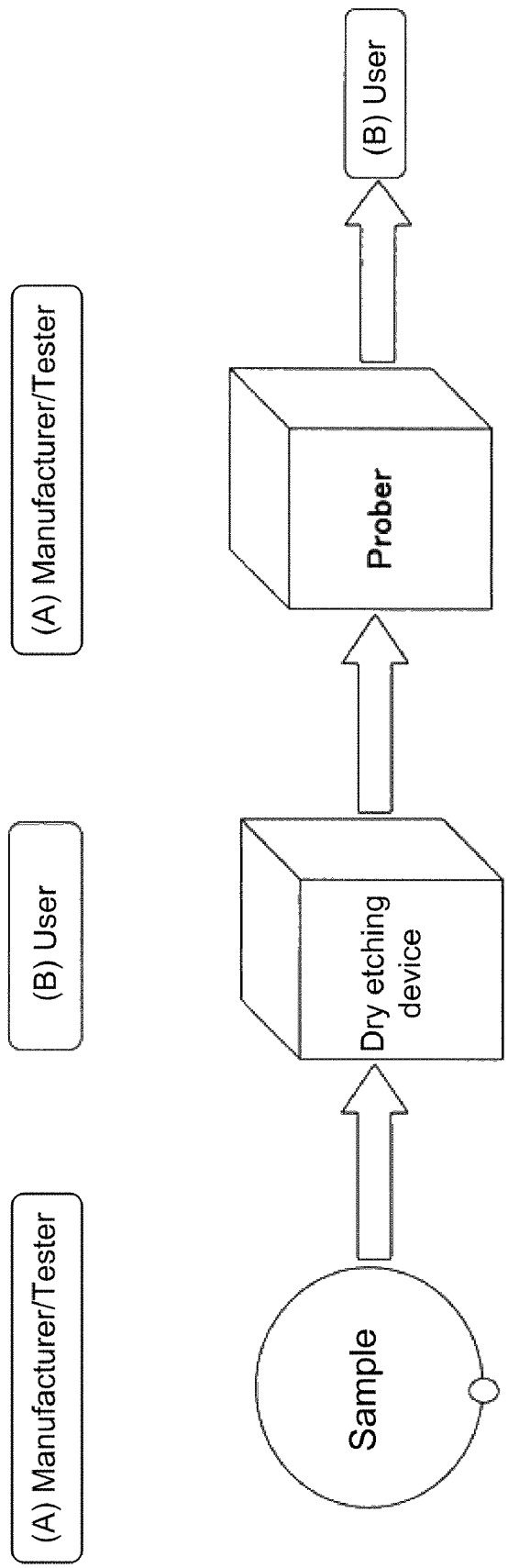
FIG. 9 is a schematic view showing a method of measuring a resistivity of a sidewall of a contact hole according to a fourth embodiment of the present invention.
Figure 10:
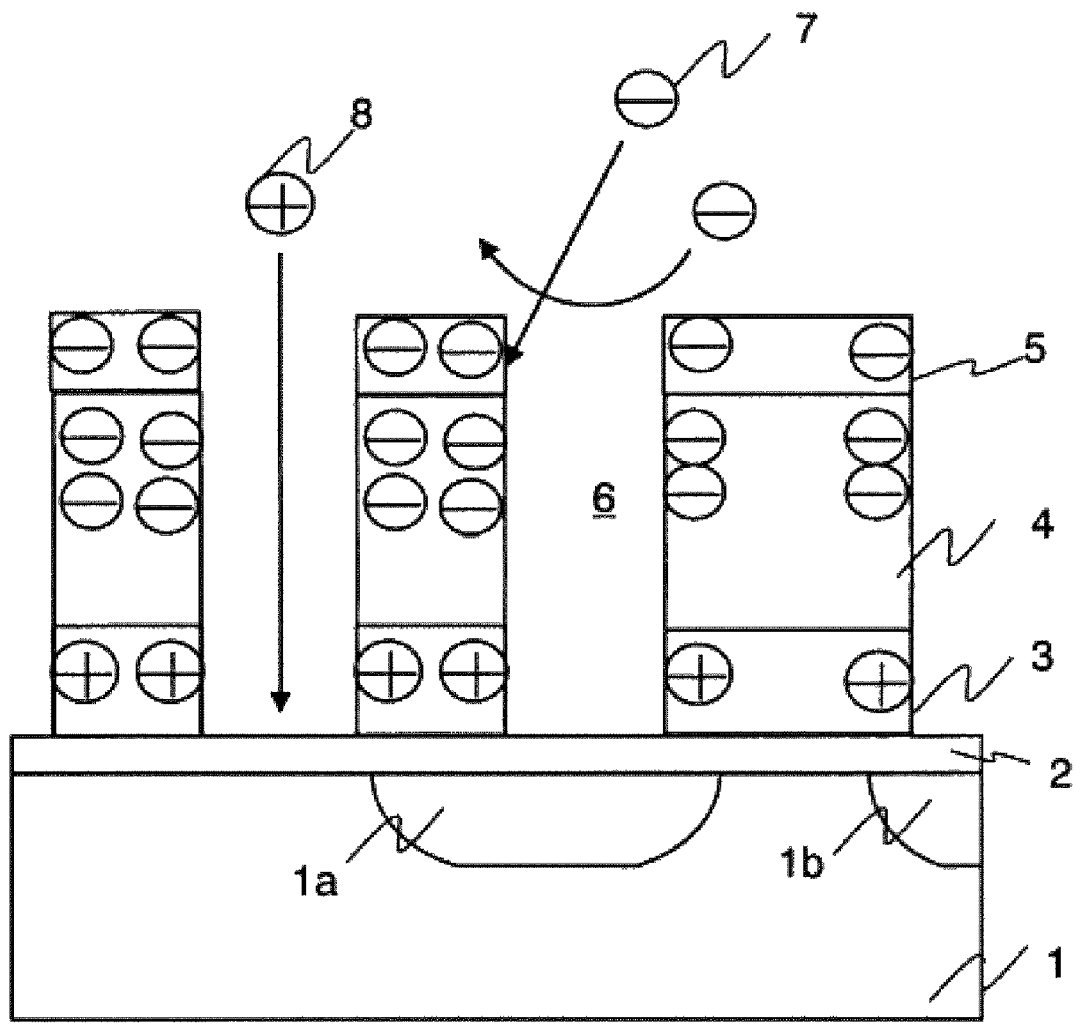
FIG. 10 is a schematic sectional view showing a wafer for explaining an electron shading effect.
Figure 11:
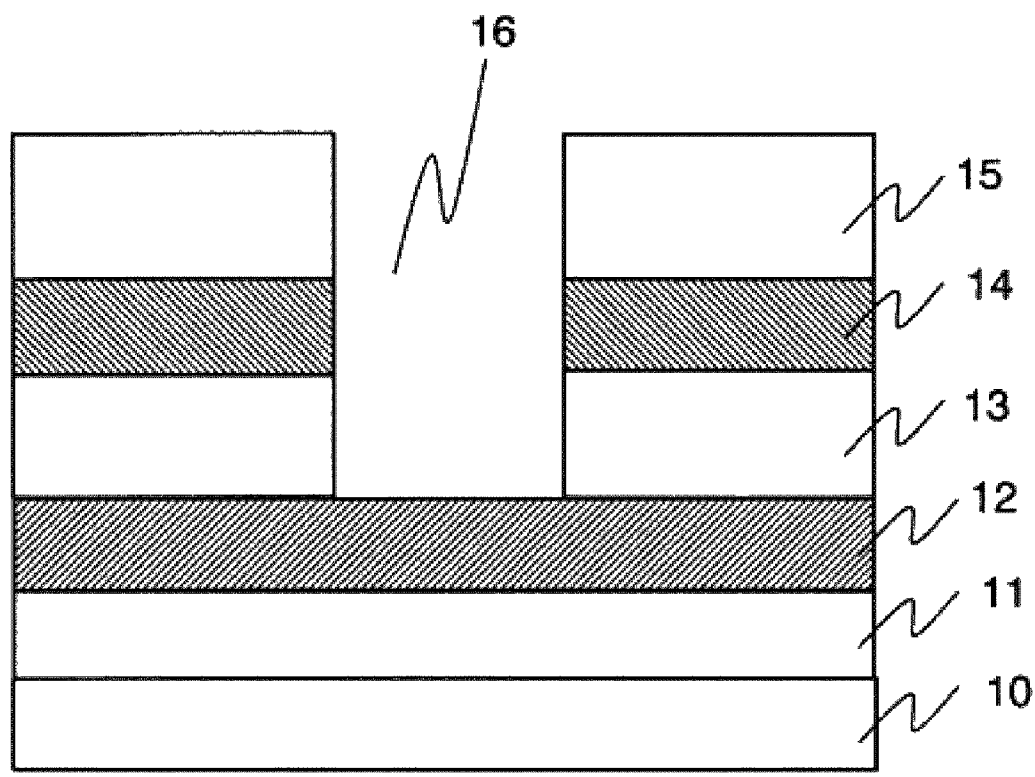
FIG. 11 is a schematic view showing a conventional method of measuring a resistivity of an organic film deposited on a sidewall of a contact hole.

A fourth embodiment of the present invention will be explained next. FIG. 9 is a schematic view showing a method of measuring the resistivity of the sidewall of the contact hole 27 according to the fourth embodiment of the present invention.

In the embodiment, the following process is performed between a manufacturer/tester (A) of a wafer and a user (B). First, in a sample wafer producing step, the manufacturer/tester (A) situated at a first processing location prepares the sample (for example, a sample wafer with the resist pattern formed thereon) in the first embodiment shown in FIG. 4(a) or the sample in the second embodiment shown in FIG. 7(b).

In the next step or a first transportation step, the sample wafer is placed in a special container filled with inert gas for preventing contamination (for example, a sealed container filled with nitrogen gas, referred to as SMIF Pod). Then, the special container is transported to the user (B) situated at a second processing location.

In the next step or an etching process step, an etching process is performed on the sample wafer under optimal conditions using a dry etching device at the second processing location where the user (B) is situated, thereby producing a processed wafer.

In the next step or a second transportation step, after the etching process, the processed wafer in the first embodiment as shown in FIG. 1(a) or in the second embodiment as shown FIG. 7(c) is placed in the SMIF Pod filled with $N_2$, and the SMIF Pod is transported and placed in a measurement device at the manufacturer/tester (A).

In the next step or a resistivity measurement step, after the processed wafer is transported to the manufacturer/tester (A), the manufacturer/tester (A) uses the auto prober in the third embodiment, so that the probe needle 31 contacts several times (for example, ten times) to measure the resistivity of the organic films 28. If necessary, the manufacturer/tester (A) creates the wafer map of the resistivity shown in FIG. 8.

In the next step or a report delivery step, if necessary, the manufacturer/tester (A) sends a report with the wafer map of the resistivity to the user (B).

As described above, in the embodiment, the processed wafer is placed in the SMIF Pod filled with $N_2$, and the SMIF Pod is transported. Accordingly, it is possible to reduce contamination to the sample wafer or an influence of moisture in an atmosphere during the transportation, thereby making it possible to accurately measure the resistivity.

The present invention is not limited to the embodiments described above, and may be modified as follows.

In the first embodiment, when the current value is measured to determine the resistivity of the organic films 28 deposited on the sidewalls the contact holes 27, the probe needle 31 contacts with the electrode pad 24b and the electrode pad 22b several times (ten times) until the electrical conductivity therebetween is established. Alternatively, it may be arranged such that the probe needle 31 contacts with the electrode pad 24b and the electrode pad 22b an arbitrary number of times until the electrical conductivity therebetween is established.

In the second embodiment, the poly-Si film 24a and the poly-Si film 22a are situated at the upper portion and the lower portion of the contact holes 27. Alternatively, the poly-Si film 24a and the poly-Si film 22a may be situated at a plurality of positions at the middle portion of the contact holes 27. With the arrangement, it is possible to measure the resistivity in more detail.

In the third embodiment, the auto prober is used for measuring the all shots of the samples. Alternatively, the auto prober may be used for measuring selected shots of the samples such as arbitrary ones of the samples or only upper halves or lower halves of the samples.

In the fourth embodiment, the processed is placed in the SMIF Pod filled with $N_2$, and the SMIF Pod is transported. Alternatively, the processed wafer may be placed in an FOUP (a sealed cassette in which a wafer is fixed and stored) or a special container. Further, the SMIF Pod may be filled with a gas other than $N_2$ as far as it is possible to prevent contamination. Further, a drying agent such as silica gel may be placed in a container for reducing moisture.

The wafer sample may be produced using a material with a method other than those in the embodiments. Further, the wafer sample may be tested with a device other than those in the embodiments. For example, a semi-automatic prober may be used as the prober.

The disclosure of Japanese Patent Application No. 2008-215897, filed on Aug. 25, 2008, is incorporated in the application.

While the invention has been explained with reference to the specific embodiments of the invention, the explanation is illustrative and the invention is limited only by the appended claims.

What is claimed is:

1. A method of measuring a resistivity of a sidewall of a contact hole formed in a semiconductor device, wherein said semiconductor device includes a first electrode formed on a substrate; a second electrode formed on the first electrode with an insulating film in between; a resist pattern formed of a photo-resist film and formed on the second electrode; a contact hole formed through a plasma etching with the resist pattern as a mask and penetrating through the first electrode and the second electrode; and an organic film deposited on the sidewall of the contact hole when the contact hole is formed, comprising the steps of:

placing a probe needle on the first electrode and the second electrode so that the probe needle contacts with the first electrode and the second electrode several times;

establishing electrical conductivity of the probe needle relative to the first electrode and the second electrode; and measuring the resistivity of the organic film between the first electrode and the second electrode.

2. The method according to claim 1, wherein, in the step of placing the probe needle on the first electrode and the second electrode, said first electrode is situated at a lower portion of the contact hole and said second electrode is situated at a middle portion or an upper portion of the contact hole.

3. The method according to claim 1, wherein, in the step of placing the probe needle on the first electrode and the second electrode, said first electrode and said second electrode are formed of poly-silicon films.

4. The method according to claim 1, wherein, in the step of measuring the resistivity of the organic film between the first electrode and the second electrode, said substrate includes a wafer so that the resistivity of the organic film is represented as a wafer map.

5. The method according to claim 1, wherein, in the step of placing the probe needle on the first electrode and the second electrode, said probe includes an auto prober controlled with a processor executing a specific measurement program.

6. The method according to claim 1, further comprising the steps of preparing at a first processing location a sample of the semiconductor device having the first electrode, the second electrode, and the resist pattern; performing the plasma etching on the sample at a second processing location away from the first processing location to form the contact hole and the organic film so that a processed sample having the photoresist film formed on the first electrode and the second electrode is produced; and placing the probe needle on the first electrode and the second electrode of the processed sample at the first processing location.

7. The method according to claim 6, further comprising the steps of placing the sample in a container filled with a inert gas; transporting the container from the first processing location to the second processing location; placing the processed sample in the container; and transporting the container from the second processing location to the first processing location.

* * * * *